United States Patent [19]
Hebert

[11] Patent Number: 5,869,875
[45] Date of Patent: Feb. 9, 1999

[54] LATERAL DIFFUSED MOS TRANSISTOR WITH TRENCH SOURCE CONTACT

[75] Inventor: Francois Hebert, San Mateo, Calif.

[73] Assignee: Spectrian, Sunnyvale, Calif.

[21] Appl. No.: 872,589

[22] Filed: Jun. 10, 1997

[51] Int. Cl.[6] .......................... H01L 29/76; H01L 29/94; H01L 31/062; H01L 31/113
[52] U.S. Cl. .......................... 257/382; 257/383; 257/384
[58] Field of Search .................................. 257/328, 382, 257/383, 384, 386

[56] References Cited

U.S. PATENT DOCUMENTS 4,738,936  4/1988  Rice ......................................... 437/141

FOREIGN PATENT DOCUMENTS

| 60-103671 | 6/1985 | Japan | 257/382 |
|---|---|---|---|
| 2-46765 | 2/1990 | Japan | 257/382 |
| 2-222574 | 9/1990 | Japan | 257/382 |
| 5-343682 | 12/1993 | Japan | 257/383 |
| 6-21445 | 1/1994 | Japan | 257/328 |
| 6-151846 | 5/1994 | Japan | 257/382 |

OTHER PUBLICATIONS

Patent Abstracts of Japan, vol. 010, No. 379 (E–465), 18 Dec. 1986 & JP 61 172371 A (Matsushita Electric Ind Co Ltd), 4 Aug. 1986, see abstract; figures.

Ishiwaka O et al; "A 2.45 GHz power Ld–MOFSET with reduced source inductance by V–groove connections", International Electron Devices Meeting. Technical Digest (Cat. No. 38CH2252–5), Washington, DC, USA, 1–4 Dec. 1985, New York, NY, USA, IEEE, USA, pp. 166–169 XP002045942.

Patent Abstracts of Japan, vol. 015, No. 470 (E–1139), 28 Nov. 1991 & JP 03 203377 A (NEC Corp), 5 Sep. 1991. see abstract.

Patent Abstracts of Japan, vol. 018, No. 461 (E–1597), 26 Aug. 1994 & JP 06 151846 A (Toshiba Corp), 31 May 1994. see abstract.

Efland T: "Lateral DMOS Structure Development For Advanced Power Technologies" 1 Mar. 1994, Texas Instruments Technical Journal, vol. 11, Nr. 2, pp. 10–24 XP000570018. See figure 2B.

DE 38 16 002 A (Int Rectifier Corp) 8 Dec. 1988 see col. 10, line 57–Line 63; figure 6.

Patent Abstracts of Japan, vol. 009, No. 298 (E–361), 26 Nov. 1985 & JP 60 136377 A (Hitachi Seisakusho KK), 19 Jul. 1985, see abstrac.

*Primary Examiner*—Stephen D. Meier
*Attorney, Agent, or Firm*—Townsend and Townsend and Crew LLP; Henry K. Woodward

[57] ABSTRACT

A lateral diffused MOS transistor formed in a doped epitaxial semiconductor layer on a doped semiconductor substrate includes a source contact to the substrate which comprises a trench in the epitaxial layer filled with conductive material such as doped polysilicon, a refractory metal, or a refractory silicide. By providing a plug as part of the source contact, lateral diffusion of the source contact is reduced, thereby reducing overall pitch of the transistor cell. Further, source contact resistance is reduced by the presence of the conductive plug, and the reduced thermal budget requirements in forming the source contact reduces up diffusion from the doped substrate, thereby reducing parasitic capacitance.

12 Claims, 10 Drawing Sheets

- Completion of device structure
- Gate oxidation, gate material deposition (polysilicon or polycide), gate mask and etch
- Channel mask, Channel implant and channel diffusion
- N– drift mask and implant, N+ source and drain contact mask and implant
- deposition of dielectic, contact mask and contact etch
- metalization

FIG. 1
PRIOR ART

- For a P– epi thickness of approx 5 μm, P+ Sinker must be > 5 μm
- Lateral diffusion >4 μm per side
- Total Top Source contact width = (2x4 μm + contact width) = 10 μm or more
- 1/2 Cell pitch = (1/2 source contact) + (source-gate space) + gate + drift region + (1/2 drain contact) ~15 μm
- Total Cell pitch ~30 μm for a 60V LDMOS using 2 μm minimum pattern size

- Trench resuts in negligible P+ lateral
- 1/2 cell pitch = 11 microns
- Cell pitch = 22 microns, which is 26% smaller than diffused sinker device

- Completion of device structure
- Gate oxidation, gate material deposition (polysilicon or polycide), gate mask and etch
- Channel mask, Channel implant and channel diffusion
- N- drift mask and implant, N+ source and drain contact mask and implant
- deposition of dielectic, contact mask and contact etch
- metalization

LATERAL DIFFUSED MOS TRANSISTOR WITH TRENCH SOURCE CONTACT

BACKGROUND OF THE INVENTION

This invention relates generally to insulated gate field effect transistors (IGFET) such as the metal oxide silicon (MOS) transistor, and more particularly the invention relates to a lateral IGFET and MOS (LDMOS) transistor having a reduced layout area and pitch and reduced grounded source resistance and capacitance in power applications.

The laterally diffused MOS transistor is used in power-applications for low-side switches as well as for RF/microwave power amplifiers. The devices are typically fabricated in an epitaxial silicon layer (P−) on a more highly doped silicon substrate (P+). A grounded source configuration is achieved by deep P+ sinker diffusion from the source region to the P+ substrate, which is grounded.

However, the diffused sinker has a lateral diffusion which increases the necessary width of the source contact. Further, the deep P+ sinker must be kept away from the gate and channel regions in order to achieve a controlled threshold voltage. For example, in an epitaxial layer having 5 $\mu$m thickness, the P+ sinker must be greater than 5 $\mu$m in depth and will have greater than 4 $\mu$m lateral diffusion on all sides. For a 2 $\mu$m minimum pattern size, the pitch of a two transistor cell having a common source or drain is on the order of 30 $\mu$m. Further, the heat budget for a diffused sinker causes dopant out diffusion from the heavily doped substrate, which increases parasitic capacitance of the device.

The present invention is directed to a process and resulting LDMOS structure having reduced pitch, source resistance, and capacitance.

SUMMARY OF THE INVENTION

In accordance with the invention the diffused sinker of an LDMOS is replaced by a trench in the source contact area of the epitaxial layer which extends toward or to the underlying substrate. A shallow doped sinker can be diffused into the bottom surface of the trench to contact the underlying substrate or the trench can extend through the epitaxial layer into the substrate. The trench is then filled with a conductive material or plug. The reduced P+ diffusion permits reduced cell pitch, and the reduced thermal budget, as compared to a diffused sinker, reduces the lateral diffusion and the up-diffusion of the highly doped substrate. Accordingly, parasitic capacitance is reduced and source contact resistance is reduced due to the highly conductive plug.

The invention and objects thereof will be more readily apparent from the following detailed description and dependent claims when taken with the drawing.

DETAILED DESCRIPTION OF THE ILLUSTRATIVE EMBODIMENTS

Figure 1:
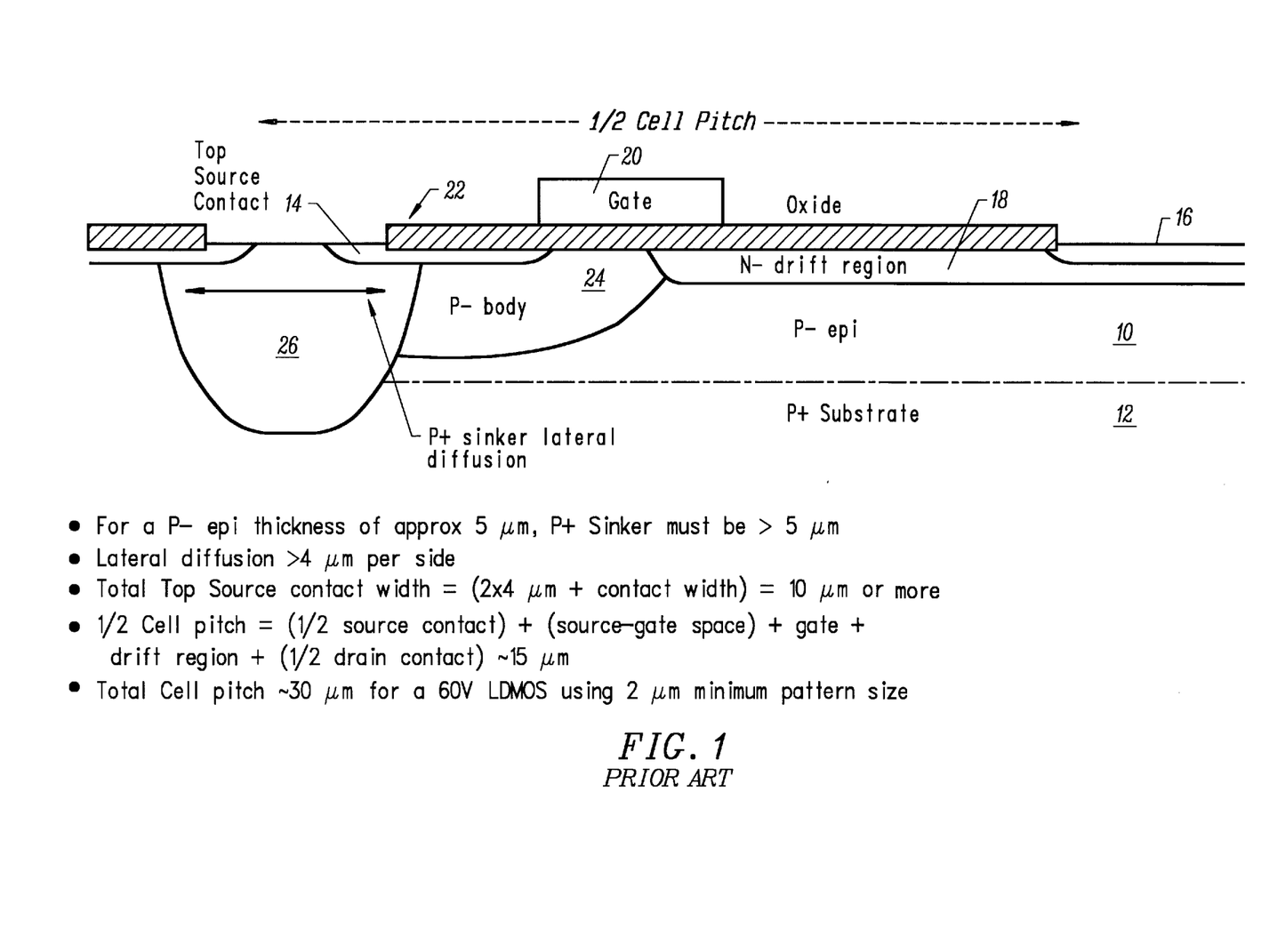
FIG. 1 is a section view of a prior art lateral diffused MOS (LDMOS) transistor.
Figure 2:
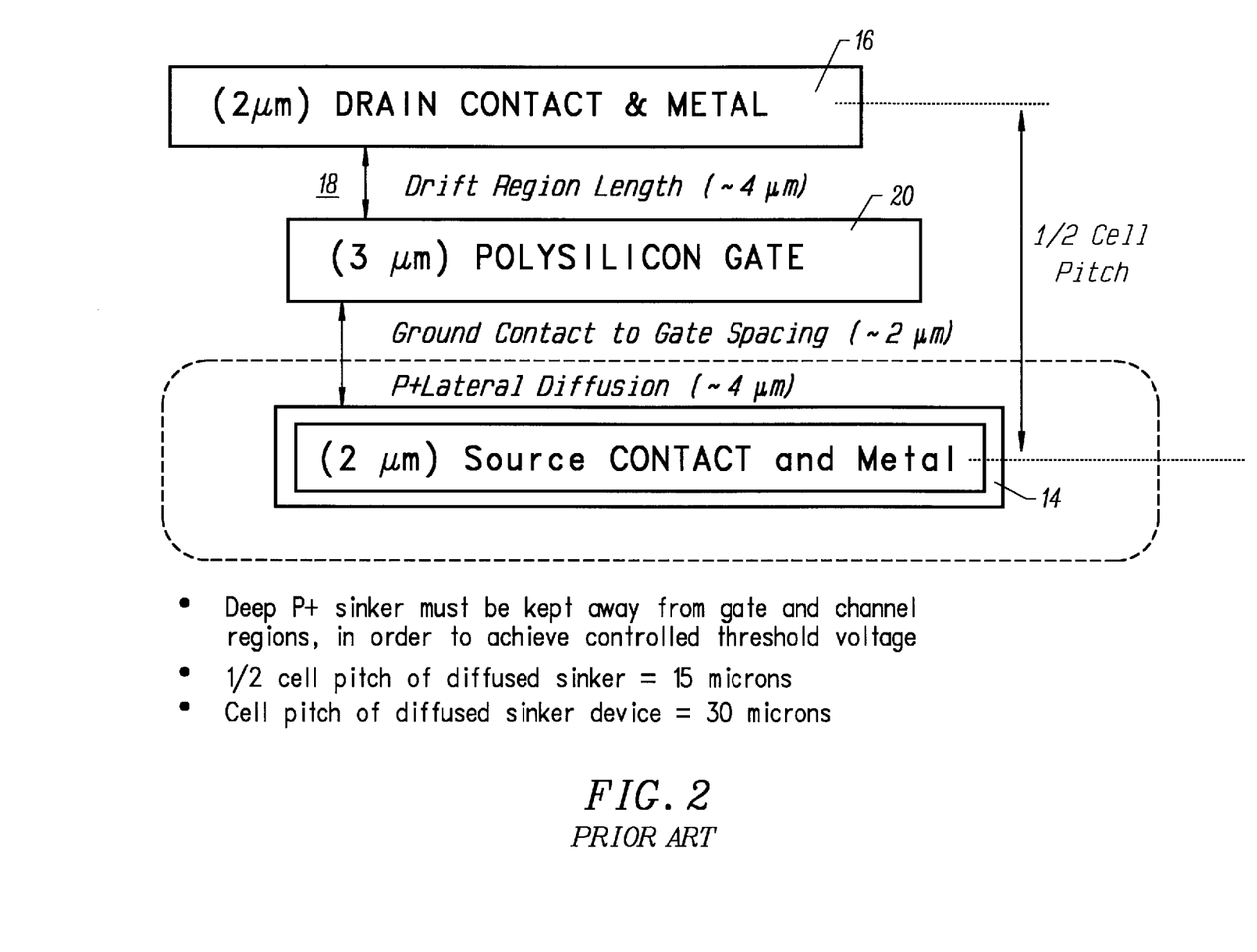
FIG. 2 is a plan view of the transistor of FIG. 1.

FIG. 1 is a section view of a diffused sinker lateral diffused MOS transistor in accordance with the prior art, and FIG. 2 is a plan view of the transistor. The device is fabricated in a P− epitaxial layer 10 grown on a P+ silicon substrate 12 which in operation is grounded. The transistor includes an N+ source region 14, and an N+ drain region 16 including an N− drift region 18. A gate contact 20 is positioned on a silicon oxide insulative layer 22 above the channel region 24 between the source 14 and N− drift region 18 of the drain. The channel 24 is formed from the P− epitaxial layer into which the source region and N− drift region are diffused.

For a grounded source device operation, heretofore a P+ sinker region 26 is diffused from the surface of the epitaxial layer 10 towards or to the P+ substrate 12 and then heated to diffuse the dopant and provide a conductive path from the source to the substrate. For an epitaxial layer having a thickness of approximately 5 $\mu$m, the P+ sinker must be greater than 5 $\mu$m in depth, and the lateral diffusion from heat treatment will be greater than 4 $\mu$m on all sides. For a device having 2 $\mu$m minimum pattern size, the total cell pitch (2 transistors per cell) is on the order of 30 $\mu$m with the total top source contact width of at least 10 $\mu$m including the surface contact width and twice the lateral diffusion. FIG. 2 is a plan view of the device of FIG. 1 illustrating the lateral dimensions for a one-half cell pitch (1 transistor). The source and drain contacts and metal are 2 $\mu$m, the drain drift region is on the order of 4 $\mu$m, the silicon gate is 3 $\mu$m, ground contact to gate spacing is 2 $\mu$m, and the P+ lateral diffusion is 4 $\mu$m.

In accordance with the present invention, the P+ sinker as illustrated in FIGS. 1 and 2 is replaced by a shallow conductive trench formed in or through the epitaxial layer into which P+ dopant is formed and then the trench is filled with a conductive material. The resulting source contact significantly reduces the lateral dimension necessary for the P+ sinker contact. Further, the conductive material plug in the trench reduces the vertical resistance of the contact, and the reduced thermal budget requirements limits any lateral diffusion and minimizes up-diffusion from the P+ substrate.

Figure 3:
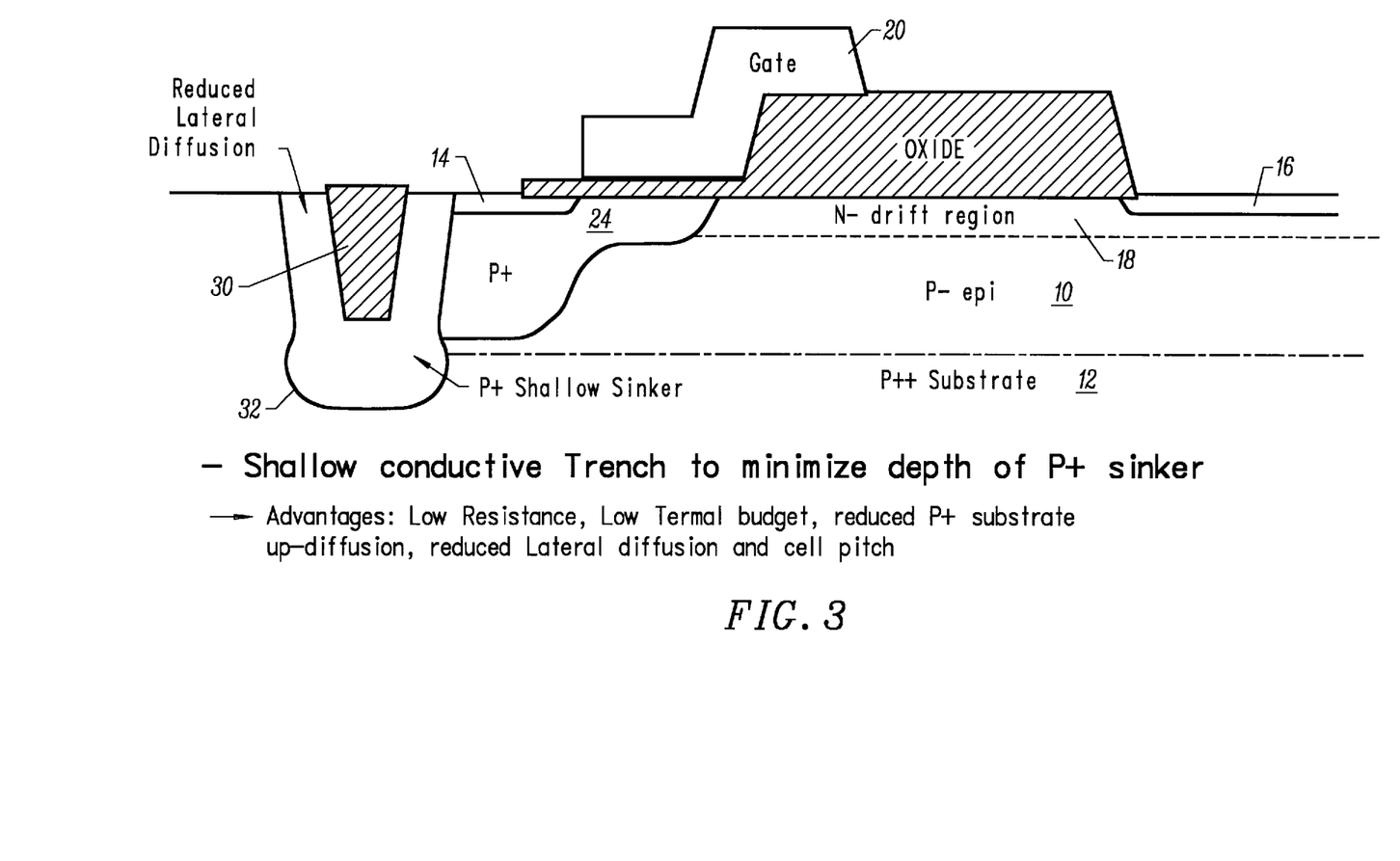
FIG. 3 is a section view of an LDMOS transistor in accordance with one embodiment of the invention.
Figure 4:
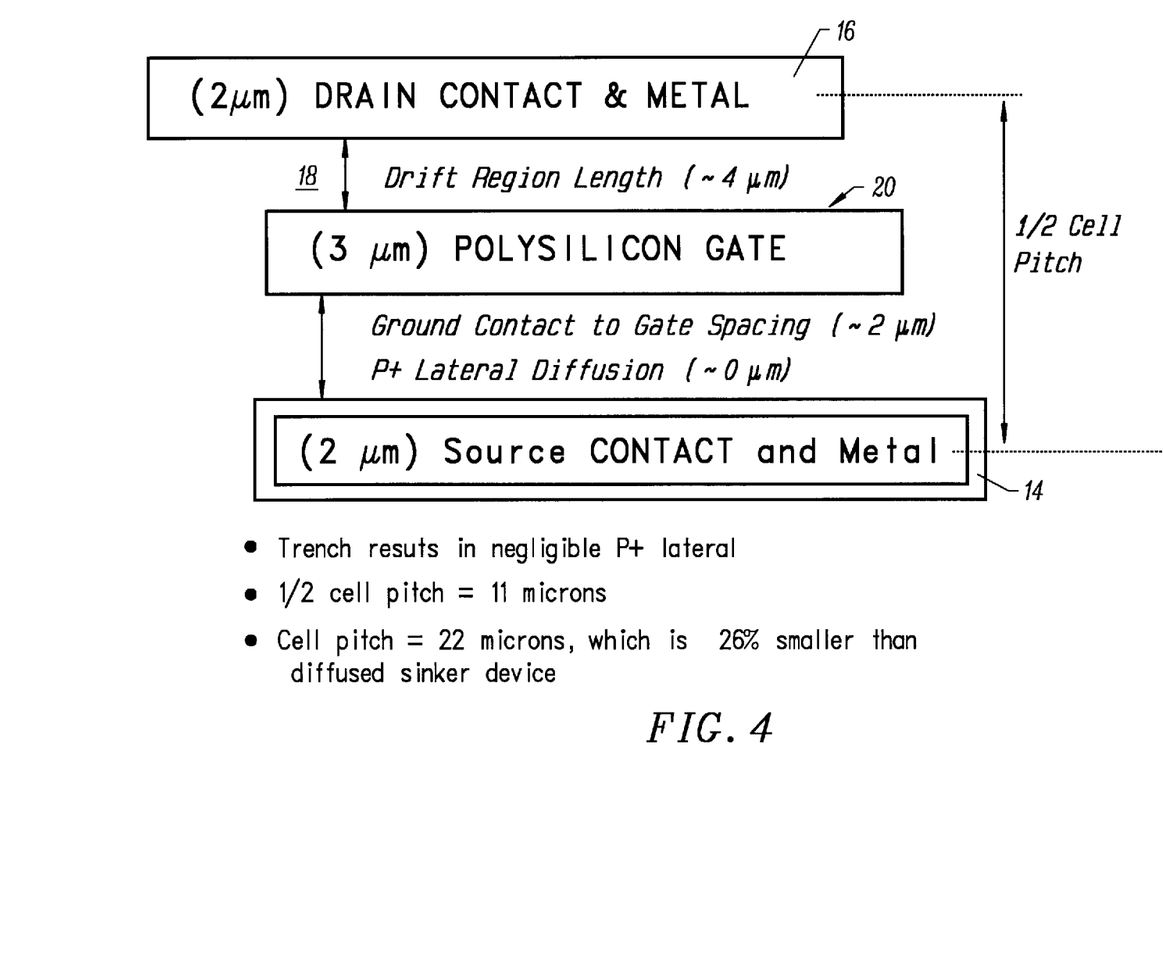
FIG. 4 is a plan view of the LDMOS transistor of FIG. 3.

Two embodiments of the invention will now be described, one with a shallow conductive trench and the other with a deep conductive trench. FIGS. 3 and 4 are a section view and plan view, respectively, of the shallow conductive trench embodiment and like elements in FIGS. 1, 2 and FIGS. 3, 4 have the same reference numerals. The P+ sinker 26 of FIG. 1 is replaced by a conductive plug 30 formed in a trench in the epitaxial layer and a P+ shallow sinker 32 formed at the bottom and on the sidewalls of the trench. In this embodiment, the oxide 22 separating the gate from the channel region is increased in thickness over the N− drift region 18 of the drain. Referring to the plan view of FIG. 4, one-half cell pitch has been reduced from 15 $\mu$m to 11 $\mu$m including one-half of the 2 $\mu$m drain contact, 4 $\mu$m drift region, 3 $\mu$m polysilicon gate, 2 $\mu$m ground contact to gate spacing, and one-half of the 2 $\mu$m source contact of metal. The shallow conductive trench minimizes the depth of the P+ sinker which results in lower resistance, lower thermal budget, reduced P+ substrate up diffusion, and reduced lateral diffusion and cell pitch. Tighter cell pitch is realized since the use of a conductive trench minimizes the amount of P+ diffusion required to reach the P+ substrate for the grounded source contact. The conductive plug has a lower resistivity than P+ doped silicon, and parasitic capacitance is reduced by minimizing the up diffusion from the P+ substrate.

FIGS. 5A–5E are section views illustrating steps in fabricating the device of FIGS. 3, 4. Depending on the channel doping and mode of device operation, the starting material can be N− epitaxial layer on P+ substrate, Pepitaxial layer on P+ substrate (as illustrated), N− epitaxial layer on P− epitaxial layer on a P+ substrate. A silicon oxide layer 40 is grown on the surface of the epitaxial layer 10, followed by a trench mask and oxide etch. The trench is then etched to a depth of approximately one-half of the epitaxial layer thickness using either photoresist or oxide as a hard mask material and fluorine, bromine, and/or chlorine base chemistries for dry etching. A P+ shallow sinker 44 is implanted at the bottom of the trench using 1E15–1E16 dose of boron or BF2 at 10–100 KeV with zero tilt preferred.

Figure 5A:
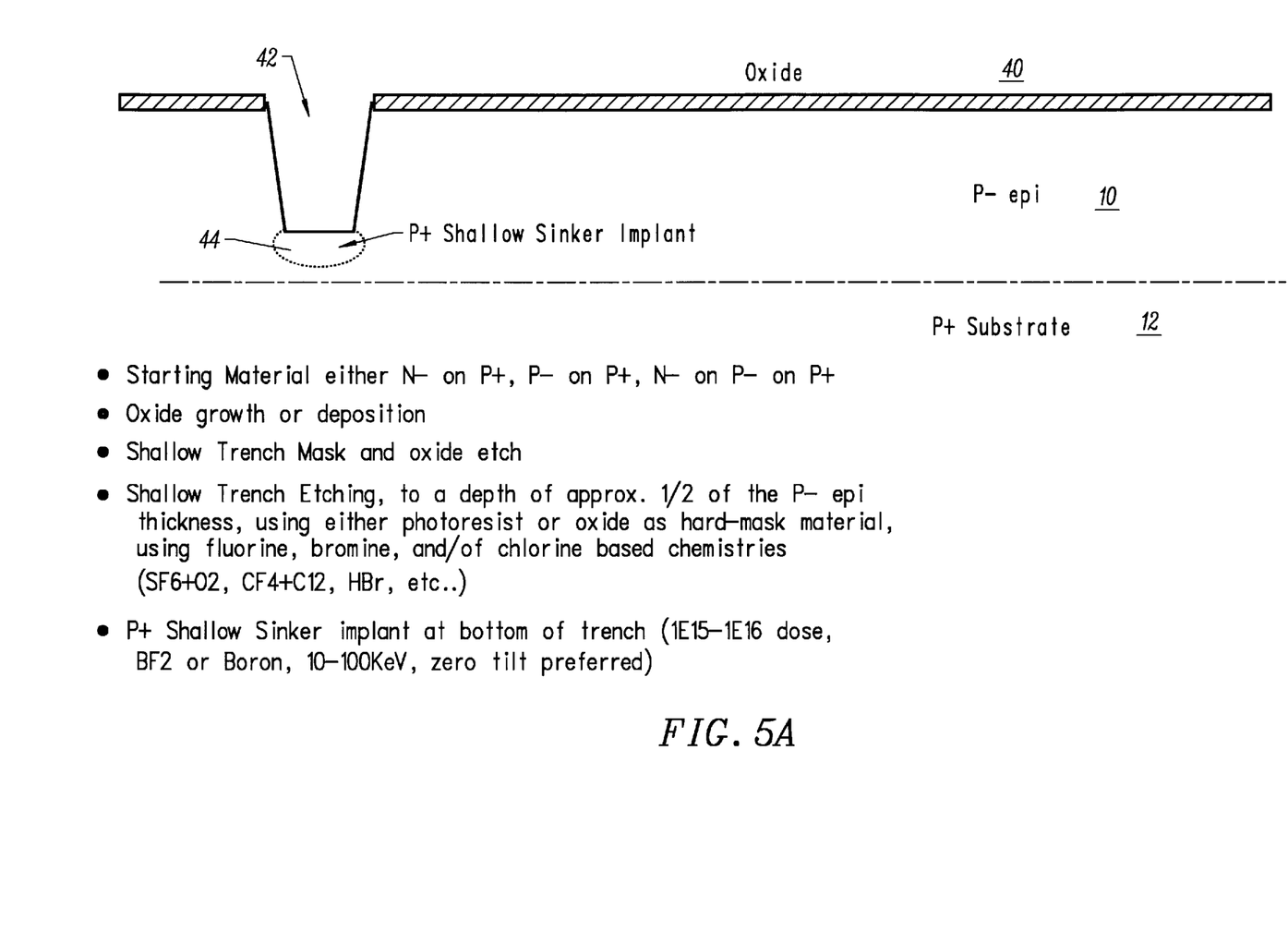
FIGS. 5A–5E are section views illustrating steps in fabricating an LDMOS transistor in accordance with one embodiment of the invention.
Figure 5B:
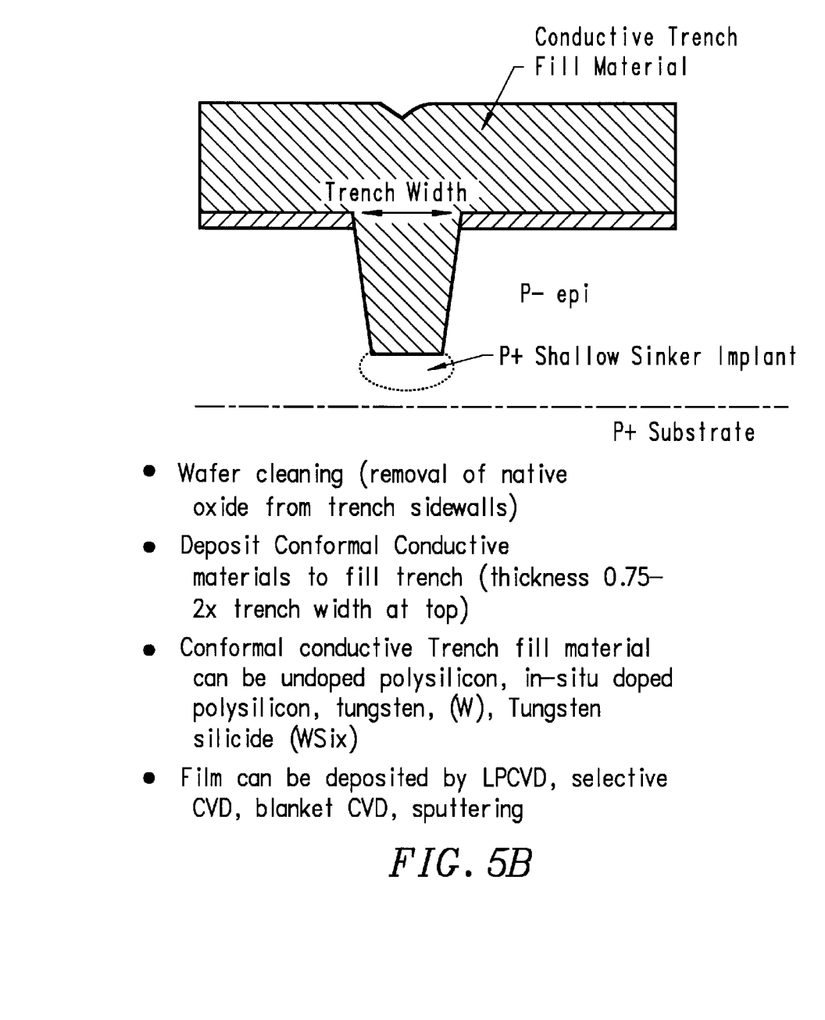

Next as illustrated in FIG. 5B, any native oxide is removed from the trench sidewalls, and a conformal conductive material is then deposited to fill the trench. The conductive trench fill material can be undoped polysilicon, in-situ doped polysilicon, tungsten (W), or tungsten silicide (WSi$_x$) for example. The film can be deposited by chemical vapor deposition and sputtering.

Figure 5C:
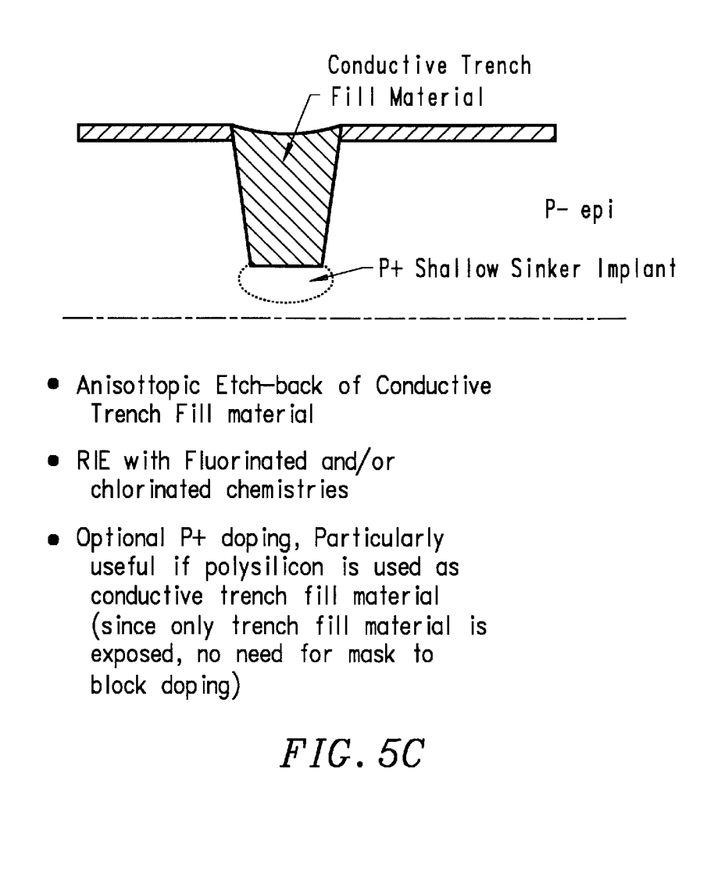

Thereafter, as illustrated in FIG. 5C, anisotropic etchback of the conductive trench fill material leaves the material solely in the trench. Reactive ion etching with fluorinated or chlorinated chemistries can be used. Optional P+ doping can be employed particularly if polysilicon is used as the conductive trench fill material. Since only the trench fill material is exposed through the silicon oxide layer, there is no need for a doping mask.

Figure 5D:
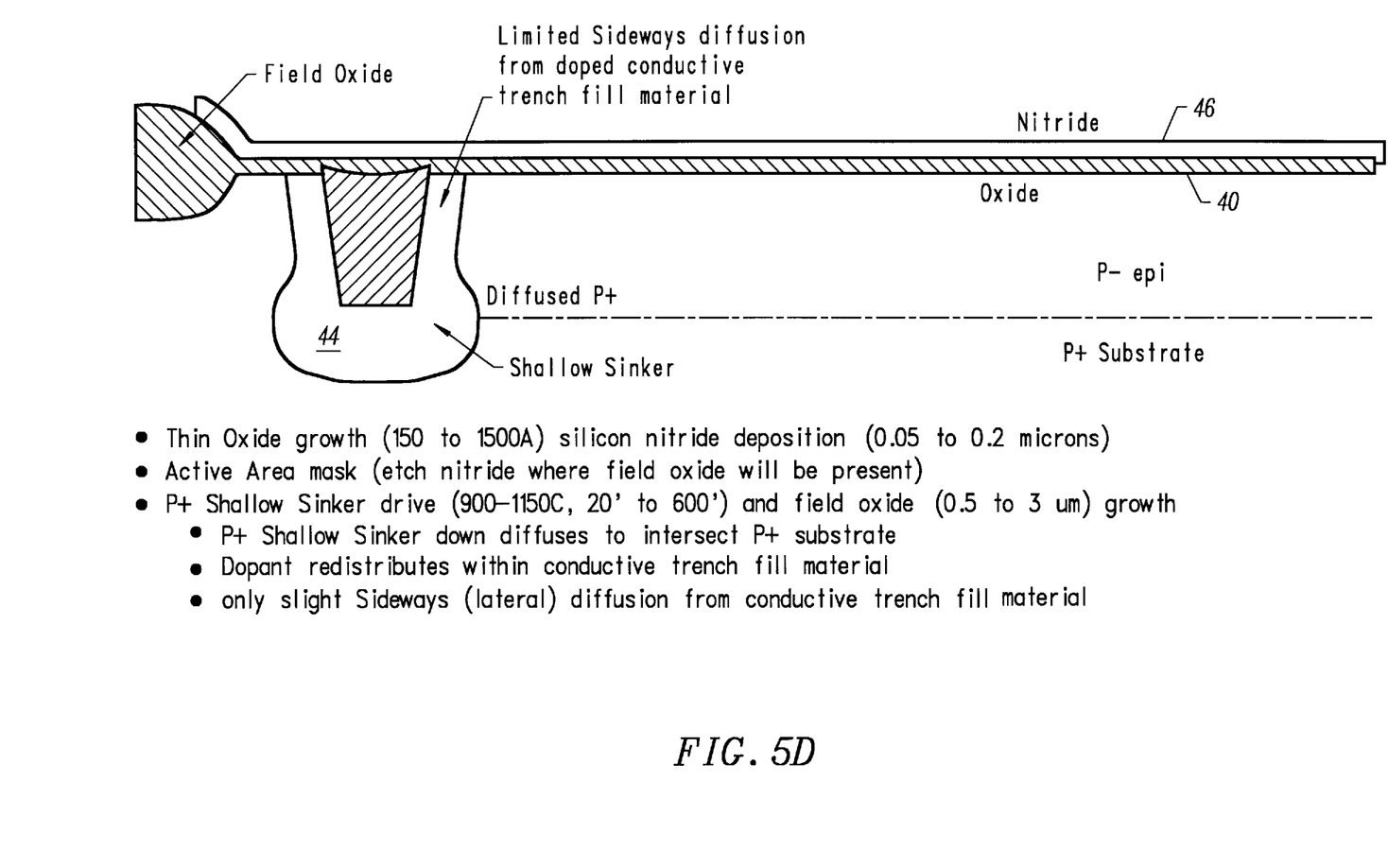
Figure 5E:
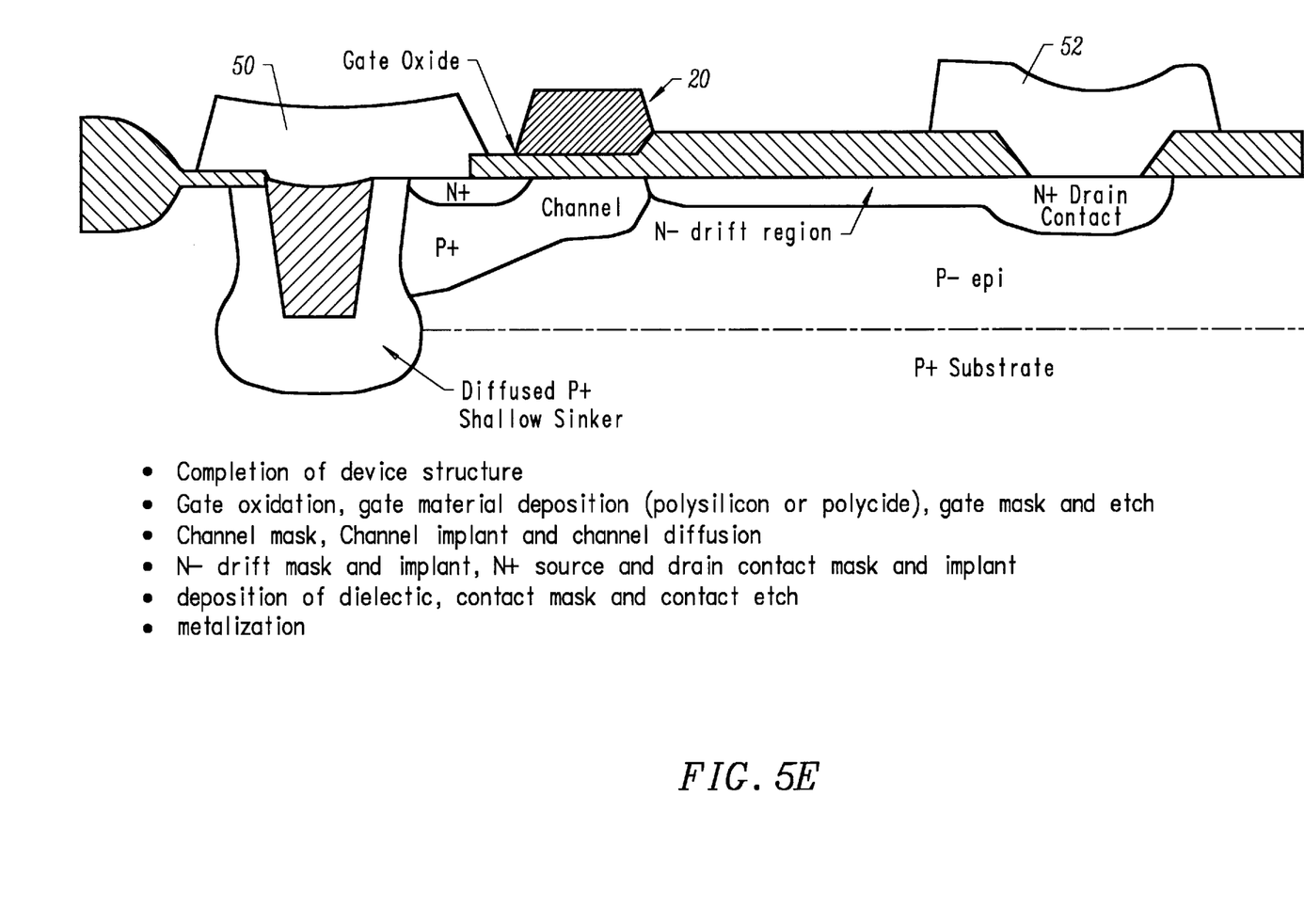

Referring to FIG. 5D, a thin oxide growth (150–1500 Å) and silicon nitride deposition (0.05 to 0.2 μm) forms nitride layer 46 and defuses the P+ shallow sinker 44 into the underlying substrate with limited sidewall diffusion from the doped conductive material in the trench. A sinker drive of 900°–1150° C. for 20–500 minutes provides field oxide growth 48 of 0.5–3 μm with the P+ shallow sinker diffusing to intersect the P+ substrate. In FIG. 5E, the device is completed with gate oxidation and gate material deposition (polysilicon or polycide), gate mask and etch followed by channel mask, channel implant and channel diffusion. The N− drift mask and implant and N+ source and drain contact mask and implant are then formed followed by deposition of a dielectric, contact mask and contact etch, and finally, metalization of the source and drain contacts 50 and 52.

Figure 6:
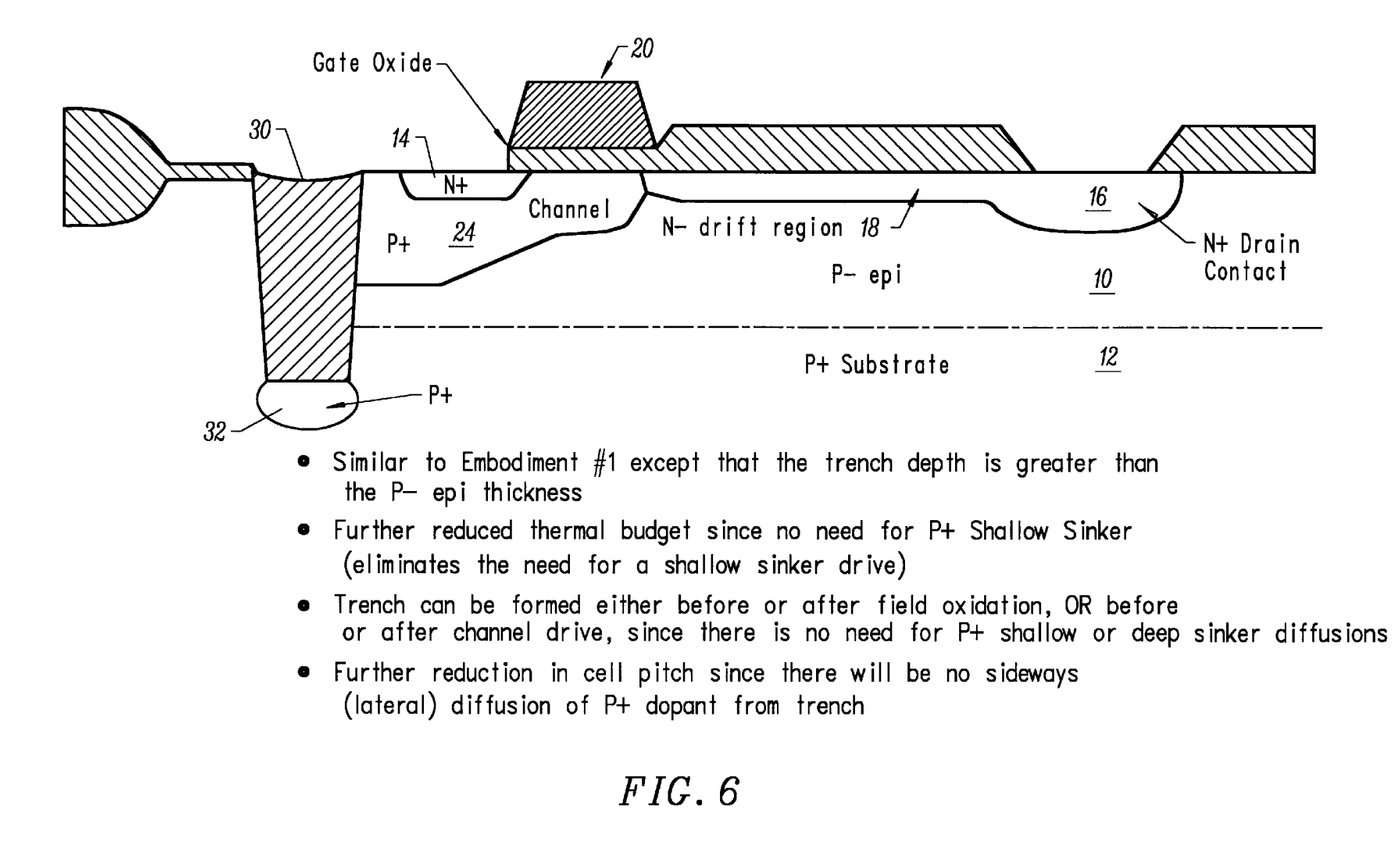
FIG. 6 is a section view illustrating an alternative embodiment in accordance with the invention.

FIG. 6 is a section view of the alternative embodiment which employs a deep conductive trench. Again, like elements in FIG. 3 and FIG. 6 have the same reference numerals. By forming the trench through the epitaxial layer and into contact with the P+ substrate 12, a further reduction in thermal budget is realized since there is no need for the P+ shallow sinker 32 or the need for the thermal drive thereof. The trench can be formed as before or after field oxidation or before or after channel drive since there is no need for the P+ shallow or deep sinker diffusions 32. Further reduction in cell pitch is realized since there will be no lateral diffusion of the P+ dopant from the trench.

Figure 7:
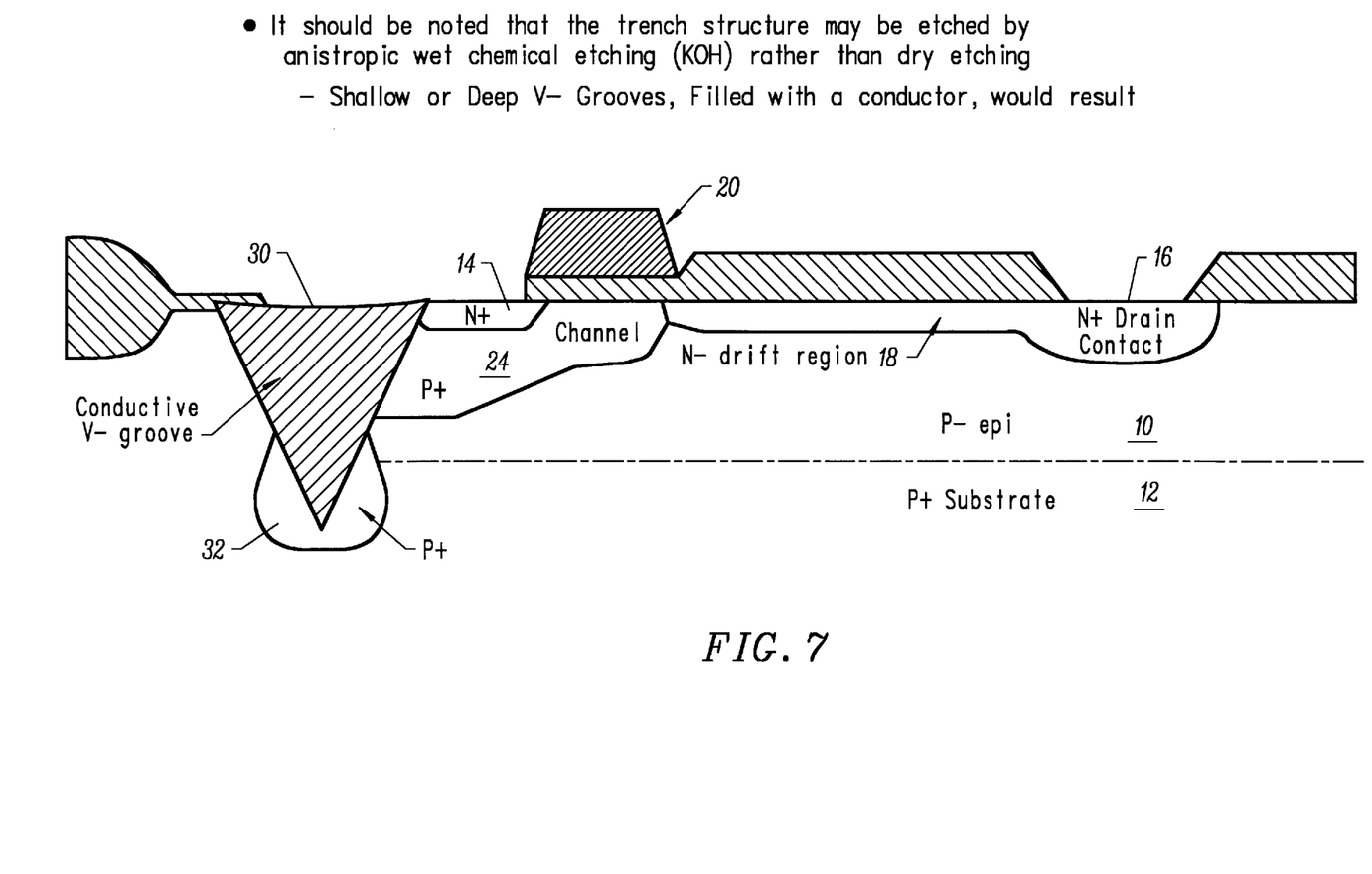
FIG. 7 is a section view illustrating another alternative embodiment in accordance with the invention.

FIG. 7 is a section view of another embodiment of the invention in which the trench structure is formed by anisotropic wet chemical etching (KOH) rather than dry etching. A shallow or deep V-groove results which is filled with a conductor 30, as shown.

There have been described several embodiments of a trench source contact structure for a lateral DMOS transistor which reduces source contact resistance and parasitic capacitance while also reducing the pitch of the resulting LDMOS structure. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A transistor structure comprising
   a) a doped semiconductor substrate,
   b) a doped epitaxial semiconductor layer formed on the substrate, the layer having a surface,
   c) a source region and a drain region formed in the epitaxial layer with a channel region therebetween,
   d) a gate electrode formed on an insulator above the channel region, and
   e) a source contact extending from the surface of the epitaxial layer into the epitaxial layer, the source contact including a trench in the epitaxial layer filled with conductive material, the trench extending only partly through the epitaxial layer and a doped sinker region extends the contact to the semiconductor substrate.

2. The transistor structure as defined by claim 1 wherein the semiconductor substrate is grounded during device operation, the source contact extending ground to the source region.

3. The semiconductor structure as defined by claim 1 wherein the transistor comprises a laterally diffused MOS transistor.

4. The transistor device as defined by claim 3 wherein the drain region includes a heavily doped region and a lighter doped drift region extending to the channel region.

5. The transistor structure as defined by claim 4 wherein the insulator under the gate electrode extends over the drift region, the thickness of the insulator being greater over the drift region than over the channel region.

6. The transistor structure as defined by claim 1 wherein the conductive material is selected from the group consisting of polysilicon, a refractory metal, and a refractory metal silicide.

7. The transistor structure as defined by claim 6 wherein said gate electrode comprises doped polysilicon.

8. The transistor structure as defined by claim 6 and further including metal contacts to the drain region, the source region, and the source contact.

9. The transistor structure as defined by claim 8 wherein one metal contact is formed to the source region and the source contact.

10. The transistor structure as defined by claim 1 wherein the semiconductor substrate is more heavily doped than the epitaxial semiconductor layer.

11. In a laterally diffused MOS (LDMOS) transistor formed in a doped epitaxial semiconductor layer on a doped semiconductor substrate, a source contact structure comprising a trench formed in the epitaxial semiconductor layer extending from a surface of the epitaxial layer and a conductive material filling the trench, the trench extending only partly through the epitaxial layer and a doped sinker region extends the contact to the semiconductor substrate.

12. The source contact structure as defined by claim 11 wherein the conductive material is selected from the group consisting of polysilicon, a refractory metal, and a refractory metal silicide.

* * * * *